(12) United States Patent
Yagishita

(10) Patent No.: US 6,353,572 B2
(45) Date of Patent: Mar. 5, 2002

(54) SEMICONDUCTOR INTEGRATED CIRCUIT

(75) Inventor: Yoshimasa Yagishita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/736,124

(22) Filed: Dec. 15, 2000

(30) Foreign Application Priority Data

Jan. 7, 2000 (JP) .......................................... 12-001745

(51) Int. Cl.[7] ................................................. G11C 8/00
(52) U.S. Cl. .............. 365/230.08; 365/233; 365/189.05
(58) Field of Search ........................... 365/230.08, 233, 365/189.05, 154

(56) References Cited

U.S. PATENT DOCUMENTS 6,011,713 A * 1/2000 Yamane et al. ............. 365/156
6,111,785 A * 8/2000 Hirano .................. 365/185.09
6,178,138 B1 * 1/2001 Derbenwick et al. .. 365/230.08

* cited by examiner

Primary Examiner—Huan Hoang
(74) Attorney, Agent, or Firm—Arent Fox Kintner Plotkin & Kahn, PLLC

(57) ABSTRACT

The supply connecting circuit selects one input signal from a plurality of input signals corresponding to a plurality of select signals in response to the activation of any one of the select signals. The supply connecting circuit connects a supply to either of the inverting circuits in the latch depending on the input signal selected. The latch is forced to be unbalanced due to the activation of one inverting circuit so as to latch a value corresponding to the input signal selected by the select signal. A value to be latched is determined with the states of the input signals supplied at the activation of a select signal. This minimizes the settling periods of the input signals with respect to the select signals. As a result, the timing margins of the circuit increase, thereby realizing high speed operations.

7 Claims, 10 Drawing Sheets

SEMICONDUCTOR INTEGRATED CIRCUIT

BACKGROUND OF THE INVENTION

1. Field of the Invention

The present invention relates to a semiconductor integrated circuit, and more particularly to a technique for latching address signals in a semiconductor integrated circuit having memory cells.

2. Description of the Related Art

With the development of semiconductor manufacturing technology, a semiconductor integrated circuit has been increasing its operating speed. In particular, microcomputers and the like has been improving in operating frequency year by year, which increases disparity from the operating frequencies of semiconductor memories such as DRAMs.

To narrow this disparity, there have been developed high speed DRAMs including SDRAMs (Synchronous DRAMs) and DDR SDRAMs (Double Data Rate Synchronous DRAMs). SDRAMs perform data transfer from/to exterior in serial, and read/write data from/to memory cells in parallel so as to improve data transmission speed.

Nevertheless, a data bus usage rate decreases during random accesses when the SDRAMs perform read operations and write operations in combination. A drop in data bus usage rate lowers the transmission amount of data per unit time. On this account, it has been difficult for high speed DRAMs such as SDRAMs to be used as, for example, graphics memories which perform frequent random accesses such as image processing.

In the meantime, for the sake of improvement in data bus usage rate, there have recently been proposed SDRAMs having a function called "delayed write", in which write data supplied in correspondence with a write command is written to memory cells at the time of supplying the next write command.

FIG. 1 shows the operation of a DDR-SDRAM having a delayed write function. In this example, the number of clock cycles from the acceptance of a read command to the output of read data, or a read latency, is set at "2". The number of clock cycles from the acceptance of a write command to the output of write data, or a write latency, is also set at "2".

Initially, in synchronization with a clock signal CLK, read commands RD0, RD1 and read addresses ADR0, ADR1 are successively supplied as a command signal CMD and an address signal ADD, respectively, so that a memory core operates (FIG. 1, (a)). Then, two clocks after the acceptance of the individual read commands RD0 and RD1, read data Q00, Q01, Q10, and Q11 are output in succession as a data signal DQ (FIG. 1, (b)).

Next, two clocks after the acceptance of the read command RD1, a write command WR0 and a write address ADW0 are supplied (FIG. 1, (c)). The write address ADW0 is held in an address resister temporarily. Here, in synchronization with the write command WR0, previous write data held in a data resister is written to the memory core by using a previous write address held in the address register (FIG. 1, (d)).

Write data DA0 and DA1 are supplied two clocks after the write command WR0. That is, the write data DA0 and DA1 are supplied in synchronization with the clock signal CLK after the output of the read data Q11 (FIG. 1, (e)). The write data DA0 and DA1 are held in the data resister temporarily (FIG. 1, (f)).

Then, in synchronization with the clock signal CLK subsequent to the write command WR0, read commands RD2, RD3, and RD4 are supplied in succession, and read operations are carried out (FIG. 1, (g)).

Moreover, two clocks after the acceptance of the read command RD4, a next write command WR1 and write address ADW1 are supplied (FIG. 1, (h)). Input/output circuits and the memory core operate in synchronization with the write command WR1, whereby the write data DA0 and DA1 held in the data register are written to the memory core by using the previous write address signal ADW0 held in the address register (FIG. 1, (i)).

Next, write data DA2 and DA3 are supplied two clocks after the write command WR1. The contents of the data register are rewritten by the write data DA2 and DA3 (FIG. 1, (j)).

As described above, in an SDRAM having a delayed write function, write operations on memory cells are performed at different timing from the accepting timing of write data. This avoids a conflict between the operation of the memory core corresponding to a write command and the operation of the memory core unit corresponding to a read command supplied immediately after the write command. As a result, the data bus usage rate improves as compared to those of ordinary SDRAMs and the amount of data transfer increases. In other words, high speed operations are enabled.

FIG. 2 shows an address latching circuit 1 in the SDRAM having a delayed write function.

This address latching circuit 1 selects either a read address signal RADD supplied from exterior or a write address signal WADD supplied from the address register mentioned above, and outputs the same to an address decoder (not shown).

The address latching circuit 1 has a switching circuit 2 for transmitting the read address RADD, a switching circuit 3 for transmitting the write address WADD, a latch 4 consisting of two inverters, and an inverter 5. The switching circuits 2 and 3 consist of a CMOS transmission gate and an inverter for controlling the pMOS transistor (hereinafter simply referred to as pMOS) in this transmission gate. The switching circuit 2 is controlled by a read clock signal RCLK which is activated in read operations. The switching circuit 3 is controlled by a write clock signal WCLK which is activated in write operations. The latch 4 outputs an internal address signal ADDCX and, through the inverter 5, an internal address signal ADDCZ.

FIG. 3 shows an example of the operation of the address latching circuit 1. Parenthetically, in the following description, some signal names will be referred to in abbreviations such as "RADD signal" for "read address signal RADD".

Initially, the RADD signal is supplied to the address latching circuit 1 in a high-level period of the RCLK signal (FIG. 3, (a)). Here, in order to avoid a mislatch, the RADD signal is supplied throughout the high-level period of the RCLK signal. That is, the RADD signal need be supplied to satisfy both a setup time tS for a rising edge of the RCLK signal and a hold time tH for a falling edge of the same. The RADD signal is latched into the latch 4, and output as complementary ADDCZ and ADDCX signals (FIG. 3, (b)).

Moreover, the WADD signal is supplied to the address latching circuit 1 throughout a high-level period of the WCLK signal (FIG. 3, (c)). Likewise, the WADD signal also requires the setup time tS and the hold time tH. The WADD signal is latched into the latch 4 and is output as complementary ADDCZ and ADDCX signals (FIG. 3, (d)).

Now, description will be given of the malfunctions of the address latching circuit 1.

For example, when the RADD signal is changed during a high-level period of the RCLK signal (FIG. 3, (e)), it is impossible for the latch 4 to correctly latch the RADD signal (low level, here) (FIG. 3, (f)). When a hazard arises on the RCLK signal during the latching period of the WADD signal (FIG. 3, (g)), it is also impossible to correctly latch the WADD signal (low level, here) (FIG. 3, (h)). Therefore, an incorrect address signal is supplied to the address decoder. As a result, the memory core receives a correct address signal to start operating, and then receives a different address during the operation, which leads to malfunction. Furthermore, when both the RCLK signal and the WCLK signal are activated simultaneously as shown in FIG. 3(g), a feedthrough current flows due to the conflict between the RADD signal and the WADD signal.

FIG. 4 shows another address latching circuit 6.

This address latching circuit 6 includes a resetting circuit 7 which receives a latch address signal ADDL output from the latch 4 and outputs the address signals ADDCZ and ADDCX. The resetting circuit 7 has NAND gates 7a and 7b to be controlled by a reset signal RESETX. The resetting circuit 7 receives the reset signal RESETX of low level when the memory core is not in operation, and outputs the address signals ADDCZ and ADDCX of high level. Therefore, the address decoder will not be activated in the non-operational period of the memory core. The switching circuits 2, 3, and the latch 4 are identical to those of the address latching circuit 1 shown in FIG. 2.

FIG. 5 shows an example of the operation of the address latching circuit 6.

The individual signals are input at the same timing as that in FIG. 3 (FIG. 5, (a), (c), (e), and (f)). The resetting circuit 7 is activated in high-level periods of the RESETX signal, outputting the settled address signals ADDCZ and ADDCX (FIG. 5, (b) and (d)). The resetting circuit 7 is inactivated in low-level periods of the RESETX signal, outputting the address signals ADDCZ and ADDCX of high level.

Next, description will be given of the malfunctions of the address latching circuit 6.

For example, when the RADD signal is changed during a high-level period of the RCLK signal (FIG. 5, (e)), it is impossible for the latch 4 to latch the RADD signal (low level, here) correctly (FIG. 5, (f)). When a hazard occurs on the RCLK signal during the latching period of the WADD signal (FIG. 5, (g)), it is also impossible to latch the WADD signal (low level, here) correctly (FIG. 5, (h)). Consequently, the memory core malfunctions as in FIG. 3. Moreover, as in FIG. 3, a feedthrough current flows when both the RCLK signal and the WCLK signal are activated at the same time.

As described above, the conventional address latching circuits 1 and 6 might cause malfunction of memory cores depending on the timing where noise occurs.

Besides, the address latching circuits 1 and 6 need the setup times for the rising edges of the RCLK and WCLK signals, and the hold times for the falling edges of the same. Therefore, the latching of address signals requires the address signals to be validated for a long period. This hampers high speed operations.

In particular, SDRAMs having a delayed write function which have been proposed for high speed operation, require to switch address signals in accordance with command inputs from exterior, and operate internal circuits with minimum timing margins. The same holds true for SDRAMs having a plurality of memory cores (banks) independently operating.

Accordingly, it is necessary to minimize the settling period of address signals as possible in order to raise the clock frequency for high speed operations.

SUMMARY OF THE INVENTION

An object of the present invention is to provide a semiconductor integrated circuit capable of latching addresses at high speed and with reliability.

According to one of the aspects of the semiconductor integrated circuit in the present invention, the semiconductor integrated circuit comprises a latch having two inverting circuits feeding back to each other and a supply connecting circuit. The supply connecting circuit selects one input signal from a plurality of input signals corresponding to a plurality of select signals in response to the activation of any one of the select signals. The supply connecting circuit connects a supply to either of the inverting circuits in the latch depending on the input signal selected. The latch is forced to be unbalanced due to the activation of one inverting circuit so as to latch a value corresponding to the input signal selected by the select signal.

A value to be latched is determined with the states of the input signals supplied at the activation of a select signal. This minimizes the settling periods of the input signals with respect to the select signals. As a result, the timing margins of the circuit increase, thereby realizing high speed operations. Logics of the input signals are indirectly latched by connecting the supply to either of the inverting circuits for activation. This precludes the inversion of latched values, even if the select signals or the input signals change due to noises or other reasons after the latch latching the signals. In other words, the latch is prevented from malfunctioning due to noises or the like.

According to another aspect of the semiconductor integrated circuit in the present invention, a resetting circuit resets the latch upon the inactivation of all of the select signals. Complementary output signals output from the latch have same logic level owing to the resetting. This facilitates the inactivation of circuits that receive the outputs of the latch.

According to another aspect of the semiconductor integrated circuit in the present invention, the supply connecting circuit keeps connecting the supply to the inverting circuit in response to the output of the latch which is in a predetermined state upon receipt of the state of the input signal. Accordingly, the state of the latch is held uninverted thereafter even when the input signal changes. The latch is prevented from malfunctioning due to noises or the like occurring in the input signals.

According to another aspect of the semiconductor integrated circuit in the present invention, the semiconductor integrated circuit comprises a plurality of memory cells, a control circuit, and an address register. The control circuit generates a write control signal or a read control signal as the select signal in accordance with a command signal supplied from an exterior. The address register holds a write address signal supplied from the exterior in correspondence with the command signal indicating a write operation. The latch latches, as the input signal, one of the write address signal for a previous write operation output from the address register in synchronization with the write control signal, and a read address signal supplied from the exterior in synchronization with the read control signal. That is, it is possible to switch address signals for read operations and address signals for write operations at high speed in the semiconductor integrated circuit having a delayed write function for performing a write operation on memory cells by using write address held in the address register.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, the embodiments of the present invention will be described with reference to the drawings. In the individual diagrams, thick lines represent signal lines consisting of a plurality of lines. Some of the blocks connected with the thick lines are composed of a plurality of circuits.

Figure 6:
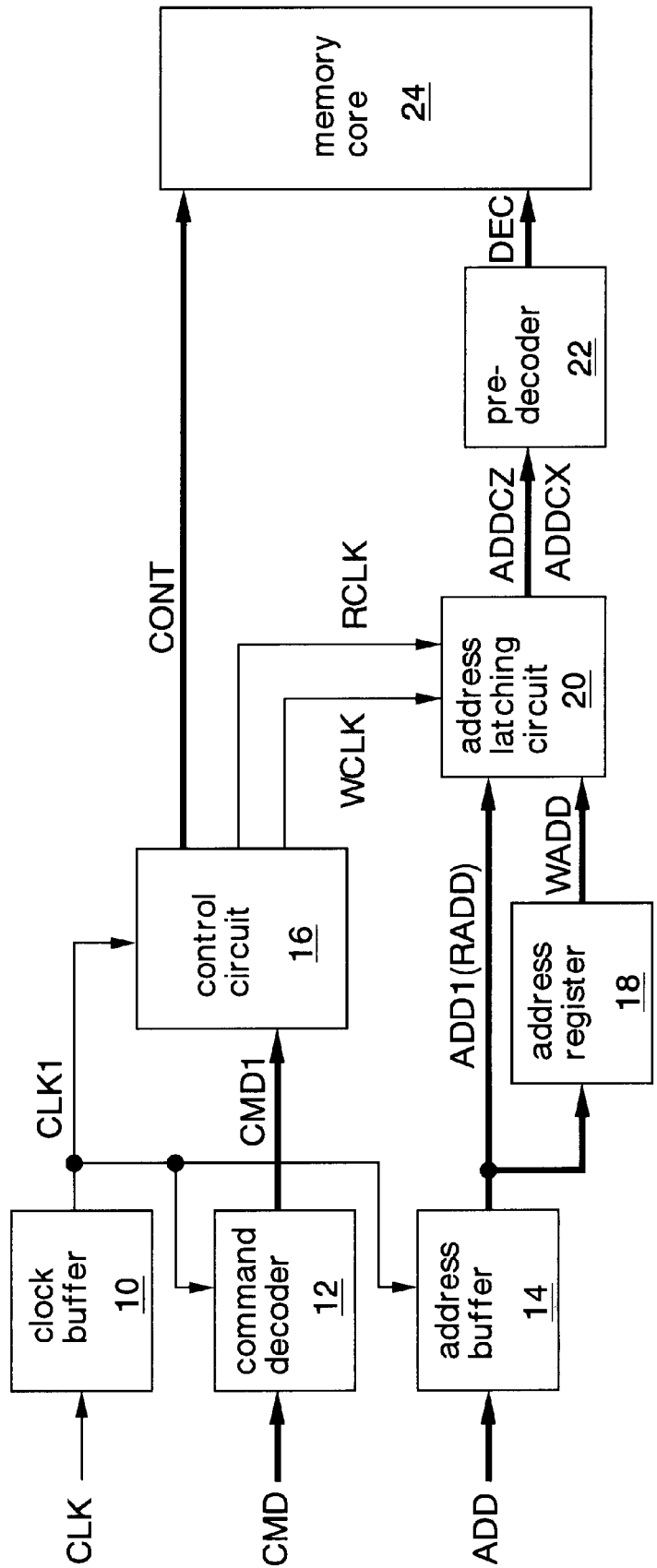
FIG. 6 is a block diagram showing a first embodiment of the semiconductor integrated circuit in the present invention.

FIG. 6 shows a first embodiment of the semiconductor integrated circuit according to the present invention.

Figure 1:
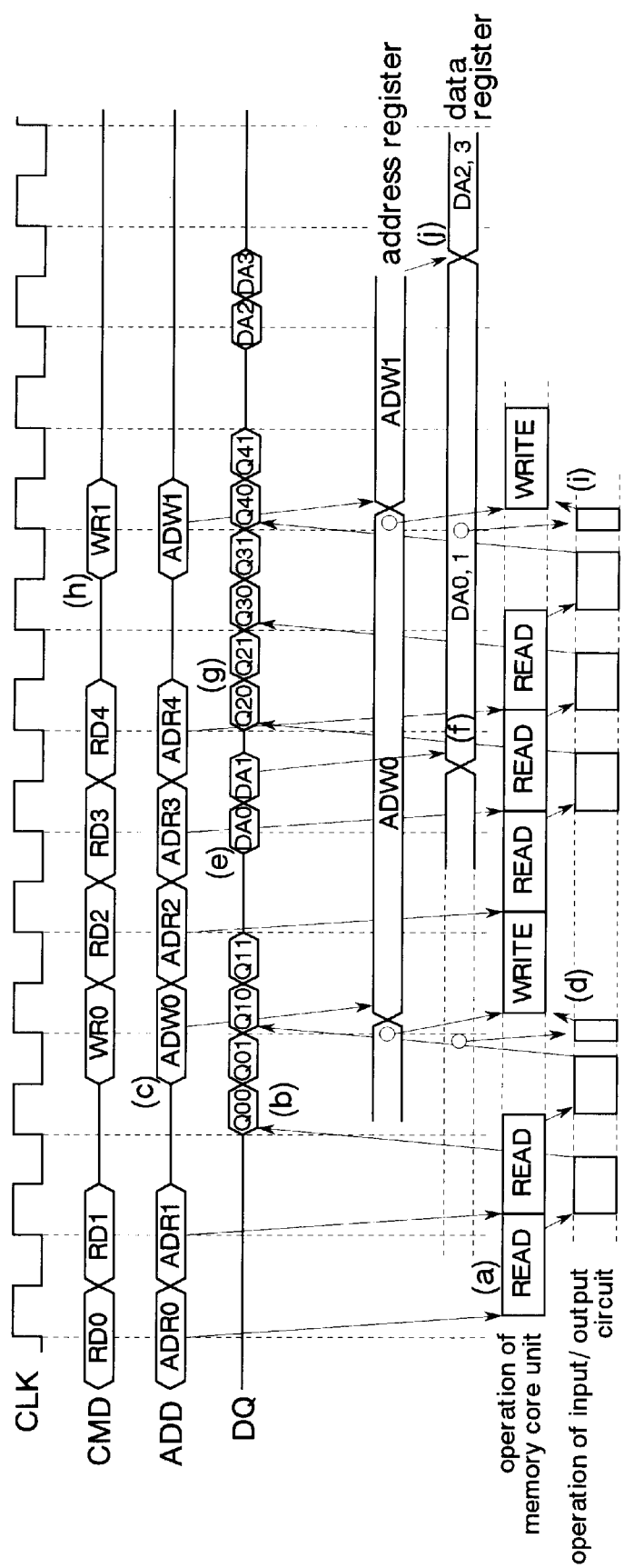
FIG. 1 is a timing chart showing the operation of a DDR SDRAM having a/conventional delayed write function.
Figure 2:
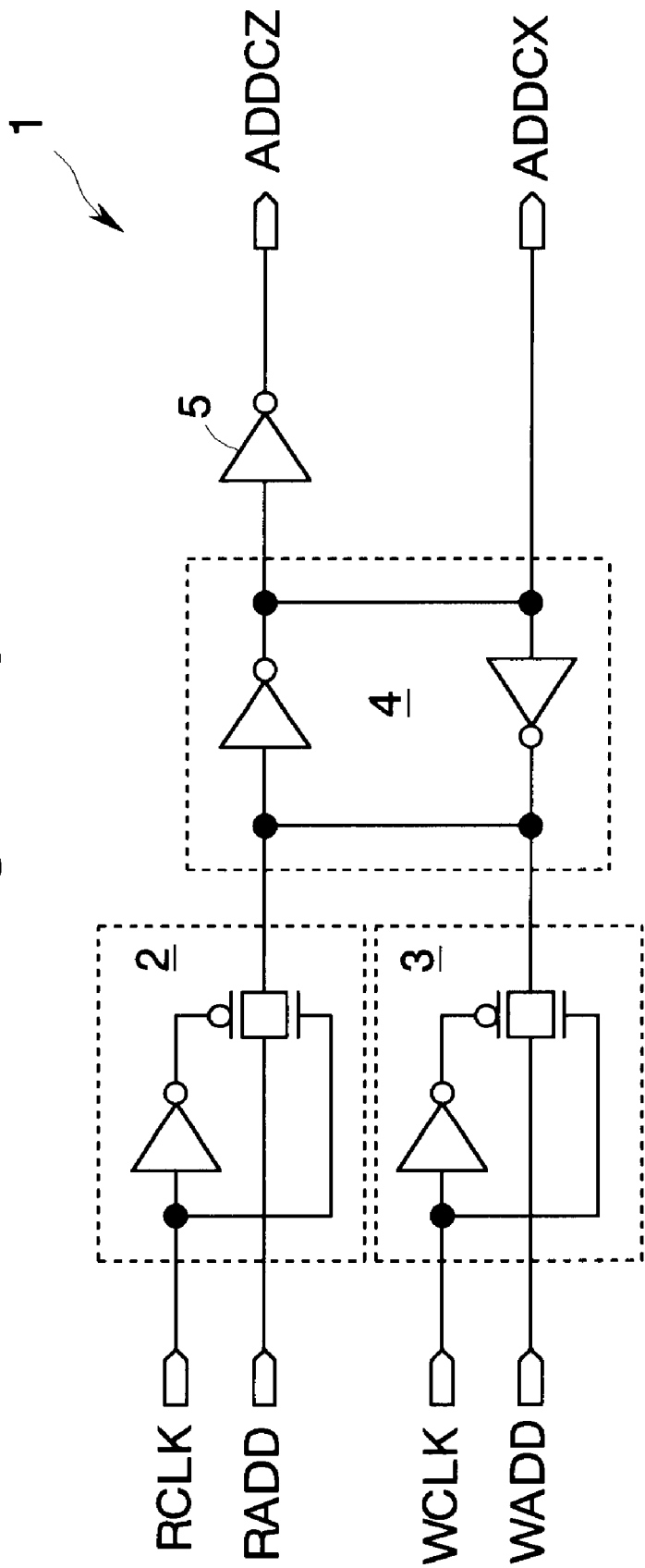
FIG. 2 is a circuit diagram showing a conventional address latching circuit.
Figure 3:
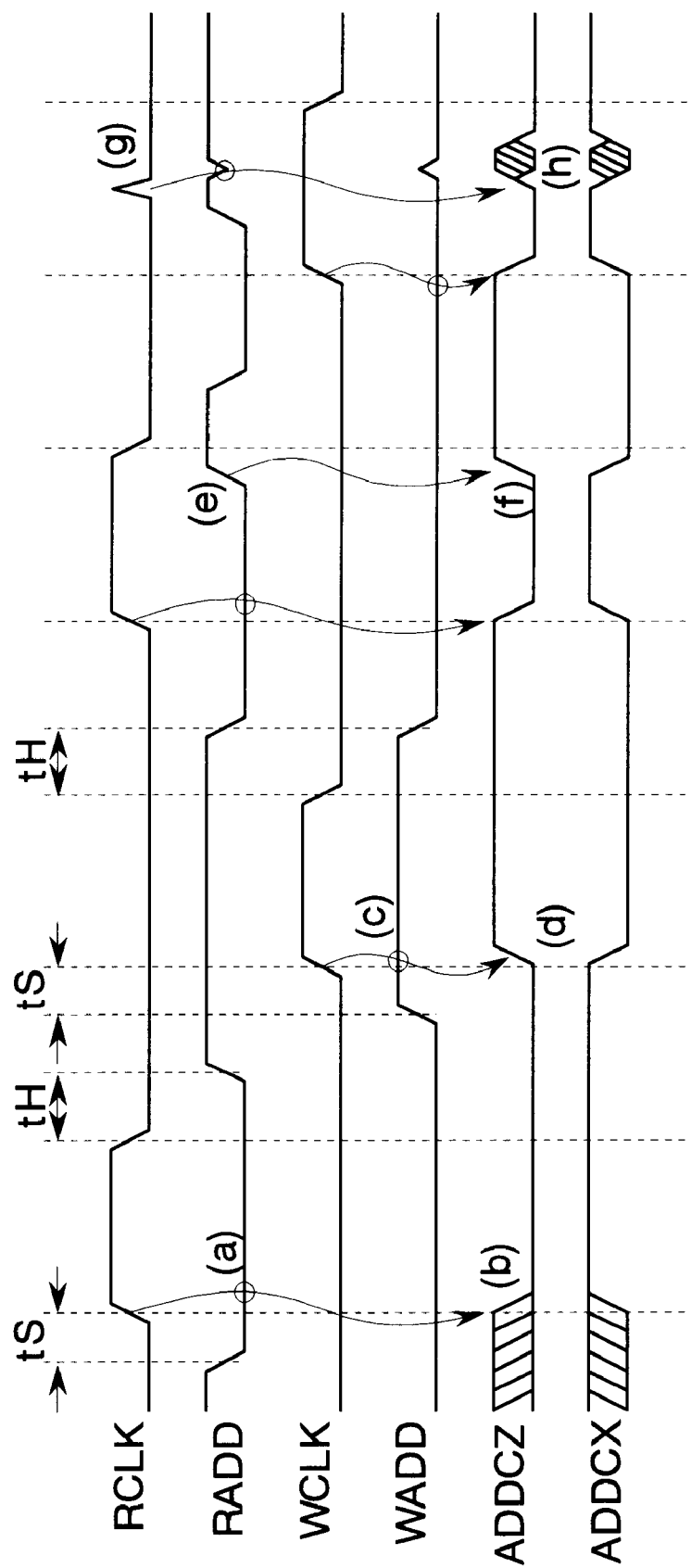
FIG. 3 is a timing chart showing the operation of the conventional/address latching circuit.
Figure 4:
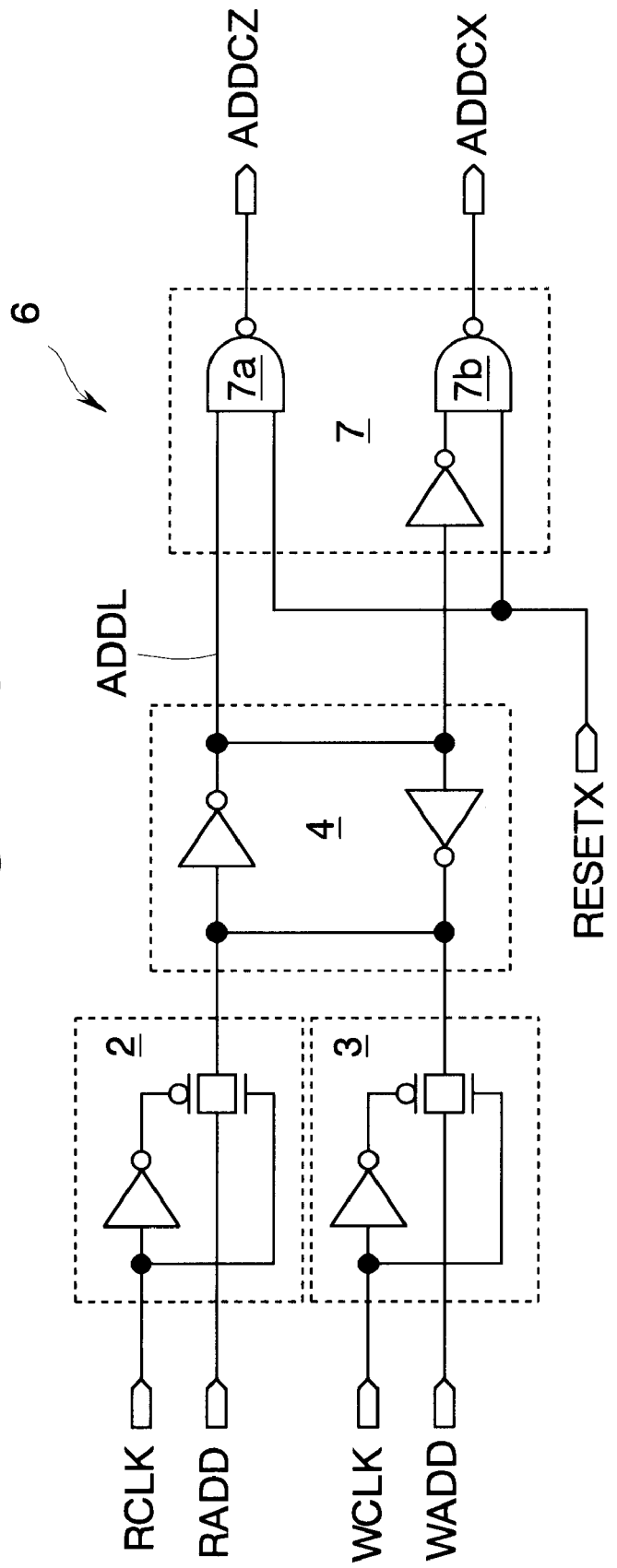
FIG. 4 is a circuit diagram showing another conventional address latching circuit.
Figure 5:
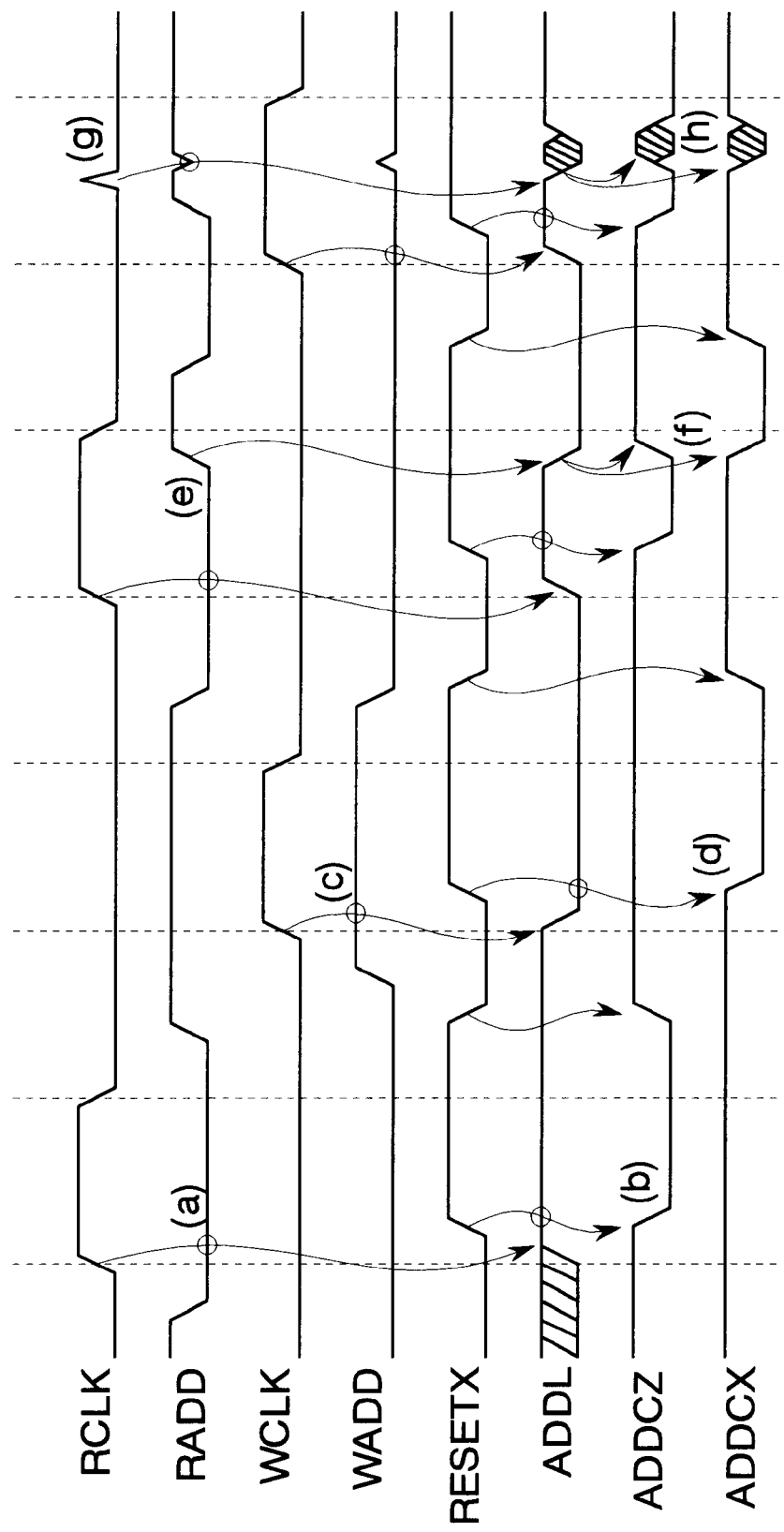
FIG. 5 is a timing chart showing the operation of the conventional address latching circuit.

The semiconductor integrated circuit in this embodiment is formed on a silicon substrate by using CMOS process, as a DDR-SDRAM having a delayed write function. In other words, the control timing of a chip during read operation and write operation is almost the same as that in FIG. 1.

This SDRAM comprises a clock buffer 10, a command decoder 12, an address buffer 14, a control circuit 16, an address register 18, an address latching circuit 20, a predecoder 22, and a memory core 24. Circuits for handling data signals are omitted from FIG. 6.

The clock buffer 10 receives a clock signal CLK from exterior, and outputs the received clock signal CLK as an internal clock signal CLK1.

The command decoder 12 receives a command signal CMD from exterior, decodes the received command signal CMD, and outputs the resultant as an internal command signal CMD1.

The address buffer 14 receives an address signal ADD from exterior, and outputs the received address signal ADD as an internal address signal ADD1.

The control circuit 16 receives the CLK1 signal and the CMD1 signal and outputs a control signal CONT, a write clock signal WCLK, and a read clock signal RCLK. The write clock signal WCLK is a kind of write control signal to be generated in write operations. The read clock signal RCLK is a kind of read control signal to be generated in read operations.

The address register 18 accepts the ADD1 signal upon the supply of a write command, and outputs the accepted signal as a write address signal WADD upon the supply of the next write command.

The address latching circuit 20 receives the WCLK signal or the RCLK signal, latches a read address signal RADD (the ADD1 signal) or the WADD signal as an input signal, and outputs internal address signals ADDCZ and ADDCX. Here, the ADDCZ signal is a signal of positive logic, and the ADDCX is of negative logic. In other words, the address latching circuit 20 outputs complementary internal address signals.

The predecoder 22 decodes the internal address signals ADDCZ and ADDCX, and outputs a decoding signal DEC.

The memory core 24 includes a plurality of not-shown memory cells, sense amplifiers, and the like. The memory core 24 is supplied with the control signal CONT and the decoding signal DEC.

Figure 7:
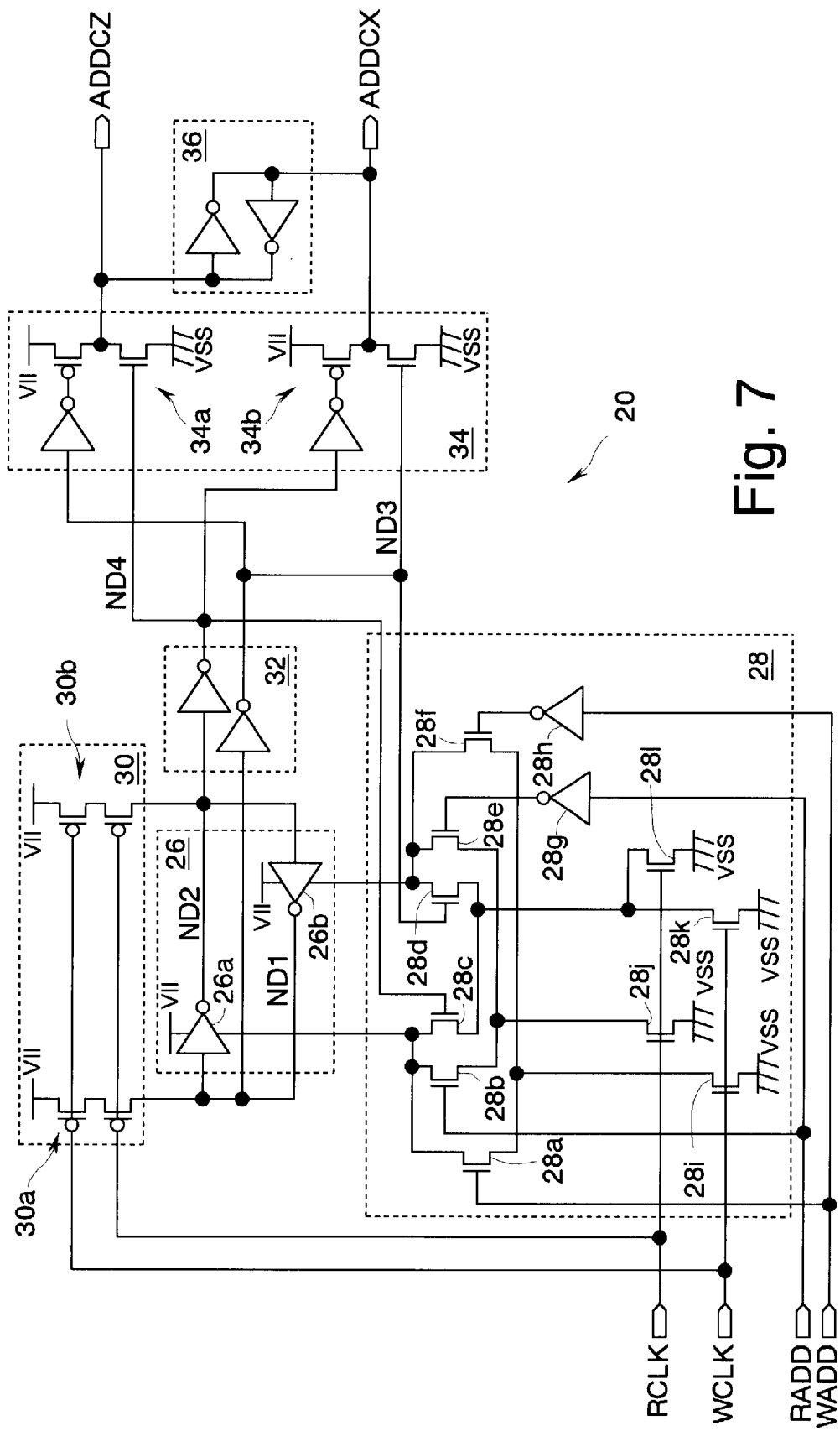
FIG. 7 is a circuit diagram showing the details of the address latching circuit in FIG. 6.

FIG. 7 shows the details of the address latching circuit 20.

The address latching circuit 20 comprises a latch 26 for latching a signal, a supply connecting circuit 28 for connecting the latch 26 to a ground line (supply line on the lower voltage side) VSS, a resetting circuit 30 for resetting the latch 26, a buffer 32, an output circuit 34, and an output latch 36.

The latch 26 has CMOS inverters 26a and 26b connected with each other at their inputs and outputs. The output of the CMOS inverter 26a is connected to a node ND2, and the output of the CMOS inverter 26b is connected to a node ND1. The sources of the pMOSs in the CMOS inverters 26a and 26b are connected to a power supply line VII. The sources of the nMOS transistors (hereinafter simply referred to as nMOSs) in the CMOS inverters 26a and 26b are connected to the supply connecting circuit 28. The CMOS inverters 26a and 26b function as inverting circuits for inverting the signals on the nodes ND1 and ND2. As will be described later, the latch 26 outputs a latched address signal as complementary output signals through the nodes ND1 and ND2.

The supply connecting circuit 28 has: nMOSs 28a, 28b, and 28c connected at their drains to the source of the nMOS in the CMOS inverter 26a; nMOSs 28d, 28e, and 28f connected at their drains to the source of the nMOS in the CMOS inverter 26b; inverters 28g and 28h for controlling the gates of the nMOSs 28e and 28f, respectively; an nMOS 28i connected at its drain to the sources of the nMOSs 28a and 28f; an nMOS 28j connected at its drain to the sources of the nMOSs 28b and 28e; and nMOSs 28k and 28l connected at their drains to the sources of the nMOSs 28c and 28d. The nMOSs 28i, 28j, 28k, and 28l are connected at their sources to the ground line VSS.

The gate of the nMOS 28b and the input of the inverter 28g are supplied with the read address signal RADD. The gate of the nMOS 28a and the input of the inverter 28h are supplied with the write address signal WADD. The gates of the nMOS 28c is connected with a node ND4. The gate of the nMOS 28d is connected with a node ND3. The gates of the nMOSs 28i and 28k are supplied with the write clock signal WCLK. The gates of the nMOSs 28j and 28l are supplied with the read clock signal RCLK.

The resetting circuit 30 has power supply parts 30a and 30b each including two pMOSs connected in series. The power supply part 30a has a source connected to the power supply line VII and a drain connected to the node ND1, and receives the WCLK signal and the RCLK signal at the two gates, respectively. The power supply part 30b has a source connected to the power supply line VII and a drain connected to the node ND2, and receives the WCLK signal and the RCLK signal at the two gates, respectively.

The buffer 32 has two inverters. The inverters are connected at the inputs to the nodes ND2 and ND1, respectively, and at the outputs to nodes ND4 and ND3, respectively.

The output circuit 34 has output parts 34a and 34b each including a pMOS and an nMOS connected in series whose sources are connected to the power supply lines VII and VSS, respectively. In the output part 34a, the gate of the pMOS is connected with the node ND3 via an inverter, and the gate of the nMOS is connected with the node ND4. In the output part 34b, the gate of the pMOS is connected with the node ND4 via an inverter, and the gate of the nMOS is connected with the node ND3. The output part 34a outputs the internal address signal ADDCZ, and the output part 34b outputs the internal address signal ADDCX.

The output latch 36 has two CMOS inverters connected with each other at their inputs and outputs. The inputs of the CMOS inverters are connected to the outputs of the output parts 34a and 34b, respectively.

Figure 8:
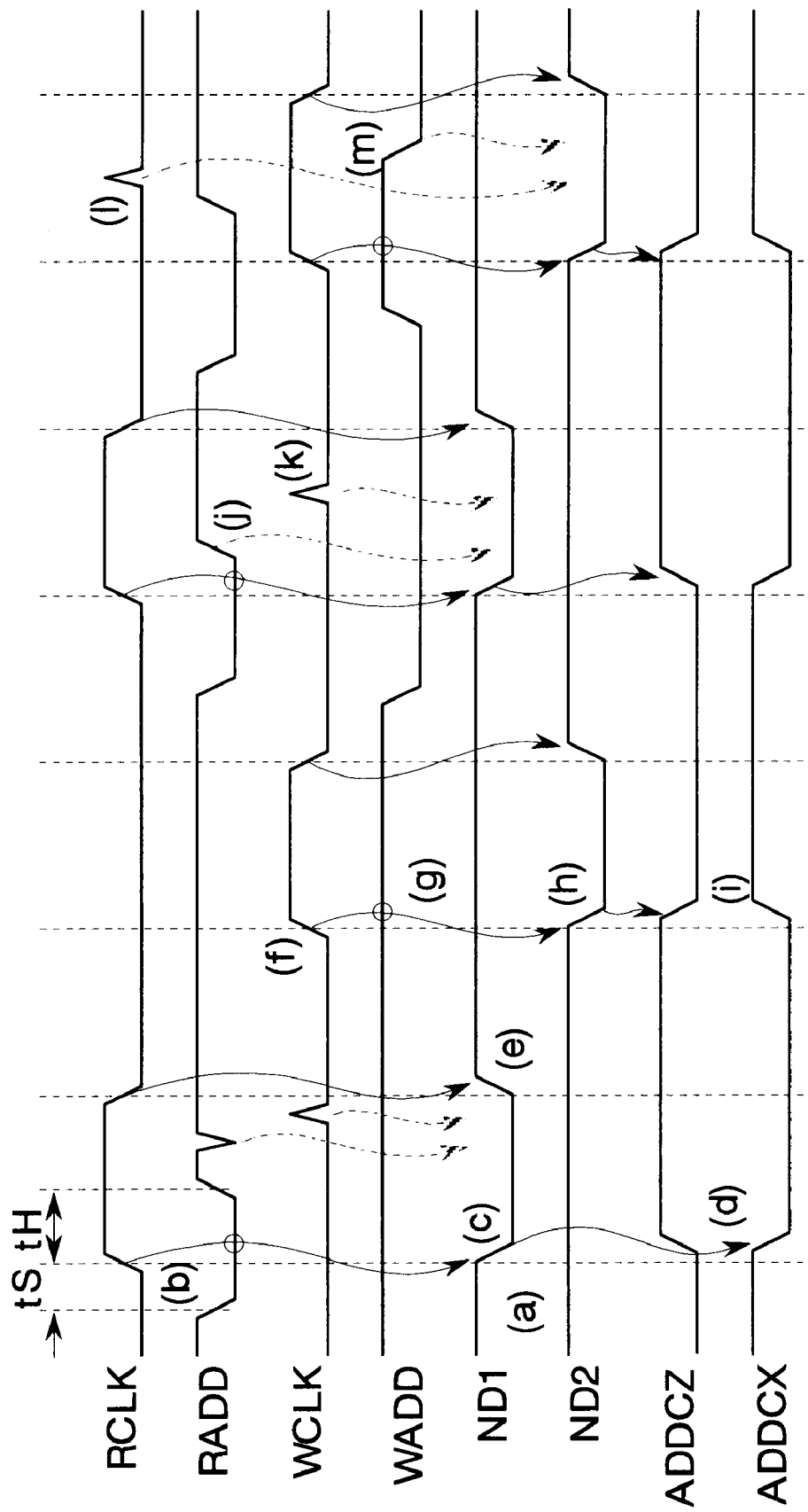
FIG. 8 is a timing chart showing the operation of the address latching circuit according to the first embodiment.

FIG. 8 shows the operation of the address latching circuit 20 in the case where read operations and write operations are performed alternately.

Initially, when both the RCLK signal and the WCLK signal are at low level, the resetting circuit 30 shown in FIG. 7 is activated to turn the nodes ND1 and ND2 to high level (FIG. 8, (a)). Here, the nMOSs 28i, 28j, 28k, and 28l in the supply connecting circuit 28 are off, so that the nMOSs of the CMOS inverters 26a and 26b in the latch 26 are inactivated. The buffer 32 receives the high levels of the nodes ND1 and ND2, and turns the nodes ND3 and ND4 to low level. As a result, the output parts 34a and 34b of the output circuit 34 are inactivated. Latched in the output latch 36 is the address signal for a previous operation. The gates of the nMOSs 28c and 28d in the supply connecting circuit 28 receive the low levels of the nodes ND3 and ND4.

Next, along with a read command, a RADD signal (low level) and its inverted signal (high level) are supplied to the gates of the nMOSs 28b and 28e in the supply connecting circuit 28, respectively. The control circuit 16 shown in FIG. 6 receives the read command, and activates the RCLK signal (FIG. 8, (b)). In response to the activation of the RCLK signal, the resetting circuit 30 is inactivated. At the same time, the nMOSs 28j and 28l in the supply connecting circuit 28 are turned on, whereby the drains of the nMOSs 28b, 28c, 28d, and 28e are connected to the ground line VSS. The nMOS 28e is turned on, receiving the inverted signal (high level) of the RADD signal so that the source of the nMOS of the CMOS inverter 26b is connected to the ground line VSS. The nMOS of the CMOS inverter 26b is activated to output a low level to the node ND1 (FIG. 8, (c)). The CMOS inverter 26a receives the low level of the node ND1 to turn its pMOS on, thereby outputting a high level to the node ND2. As a result, the RADD signal is selected by the RCLK signal so that the low-level address signal is latched into the latch 26. In this embodiment, the RADD signal has only to satisfy the setup time tS and hold time tH for a rising edge of the RCLK signal. Accordingly, the settling time of the RADD signal can be significantly shortened compared to conventional.

The buffer 32 receives the high level of the node ND2 to turn the node ND4 to low level, and receives the low level of the node ND1 to turn the node ND3 to high level. The nMOS 28d turns on in response to the high level of the node ND3. Since the nMOS 28d is on, the ground line VSS is kept connected to the CMOS inverter 26b during the activation period of the RCLK signal. That is, once the address is latched, the latch 26 is locked so that the nodes ND1 and ND2 are unsusceptible to the exterior thereafter. This prevents the address held in the latch 26 from being inverted even when the RADD signal, the WCLK signal, or the WADD signal changes due to noises or other reasons after the tuning-on of the nMOS 28d.

Such a latching control is attained by connecting the ground line VSS to either one of the CMOS inverters 26a and 26b in accordance with the address signal and forcefully unbalancing the latch 26. Here, since the latched signal is fed back to the nMOS 28d to keep the latch 26 activated, it becomes possible to minimize the hold time tH of the RADD signal for a rising edge of the RCLK signal. Moreover, any feedthrough current will not flow even if both the RCLK signal and the WCLK signal are activated at the same time.

The output parts 34a and 34b of the output circuit 34 receive the high level of the node ND3 and the low level of the node ND4, and turn the ADDCZ signal and the ADDCX signal to high level and low level, respectively (FIG. 8, (d)). The output latch 36 latches the ADDCZ signal and the ADDCX signal. Then, the predecoder 22 shown in FIG. 6 is activated to perform the read operation.

Subsequently, in response to the inactivation of the RCLK signal, the resetting circuit 30 is activated to connect the nodes ND1 and ND2 to the power supply line VII (FIG. 8, (e)). At the same time, the supply connecting circuit 28 turns its nMOSs 28j and 28l off for inactivation. As a result, the output parts 34a and 34b of the output circuit 34 are inactivated.

Next, the control circuit 16 receives a write command, and activates the WCLK signal (FIG. 8, (f)). Besides, the WADD signal (high level) and its inverted signal (low level) held in the address register 18 are supplied to the gates of the nMOSs 28a and 28f in the supply connecting circuit 28, respectively (FIG. 8, (g)). In response to the activation of the WCLK signal, the resetting circuit 30 is inactivated. At the same time, the nMOSs 28i and 28k in the supply connecting line 28 are turned on, whereby the drains of the nMOSs 28a, 28c, 28d, and 28f are connected to the ground line VSS. The nMOS 28a receives the WADD signal of high level to turn on so that the source of the nMOS of the CMOS inverter 26a is connected to the ground line VSS. The nMOS of the CMOS inverter 26a is activated to output a low level to the node ND2 (FIG. 8, (h)). The CMOS inverter 26b receives the low level of the node ND2 to turn its pMOS on, thereby outputting a high level to the node ND1. As a result, the WADD signal is selected by the WCLK signal so that the latch 26 latches the high-level address signal in.

Moreover, the buffer 32 receives the low level of the node ND2 to turn the node ND4 to high level, and receives the high level of the node ND1 to turn the node ND3 to low level. The nMOS 28c turns on under the high level of the node ND4. As in the case described above, the turning-on of the nMOS 28c locks the latch 36 during the activation period of the WCLK signal.

The output parts 34a and 34b of the output circuit 34 receive the low level of the node ND3 and the high level of the node ND4, and turn the ADDCZ signal and the ADDCX signal to low level and high level, respectively (FIG. 8, (i)). The output latch 36 latches the ADDCZ signal and the ADDCX signal. Then, the predecoder 22 shown in FIG. 6 is activated to perform the write operation.

Subsequently, a read operation and a write operation are carried out in the same manner as described above. In these operations, the latch 26, when locked, is no longer influenced by the RADD signal (FIG. 8, (j)), the WCLK signal (FIG. 8, (k)), the RCLK signal (FIG. 8, (l)), or the WADD signal (FIG. 8, (m)).

In the semiconductor integral circuit configured as described above, the nMOSs 28j and 28l, or the nMOSs 28i and 28k of the supply connecting circuit 28 are turned on under the activation of the RCLK signal or the WCLK signal, so that either one of the CMOS inverters 26a and 26b is connected to the ground line VSS depending on which signal RADD or WADD is supplied at that moment. This makes it possible to forcefully unbalance the latch 26 and latch an address signal.

The latch 26 latches the value corresponding to the RADD/WADD signal supplied at the activation of the RCLK/WCLK signal. Therefore, it is possible to minimize the setup time tS and hold time tH of the RADD/WADD signal with respect to the RCLK/WCLK signal. This allows increased timing margins of the address latching circuit 20. As a result, circuits in the semiconductor chip can operate at higher speed for performing faster read operations and write operations.

The RADD signal and the WADD signal are supplied to the gates of the nMOS 28b, 28e, 28a, and 28f, and indirectly latched into the latch 26. This can prevent the latch 26 from malfunctioning due to noises and the like.

The supply connecting circuit 28 receives the address signals latched in the latch 26 (nodes ND4, ND3) at its nMOSs 28c and 28d, to keep connecting the CMOS inverters 26a and 26b to the ground line VSS. Therefore, even when the RADD signal and the WADD signal change, the latched address signals are prevented from inversion.

Accordingly, the semiconductor integrated circuit having the delayed write function can switch the address signal for read operations and the address signal for write operations at high speed.

Moreover, a feedthrough current can be prevented from flowing even if both the RCLK signal and the WCLK signal are activated at the same time.

Figure 9:
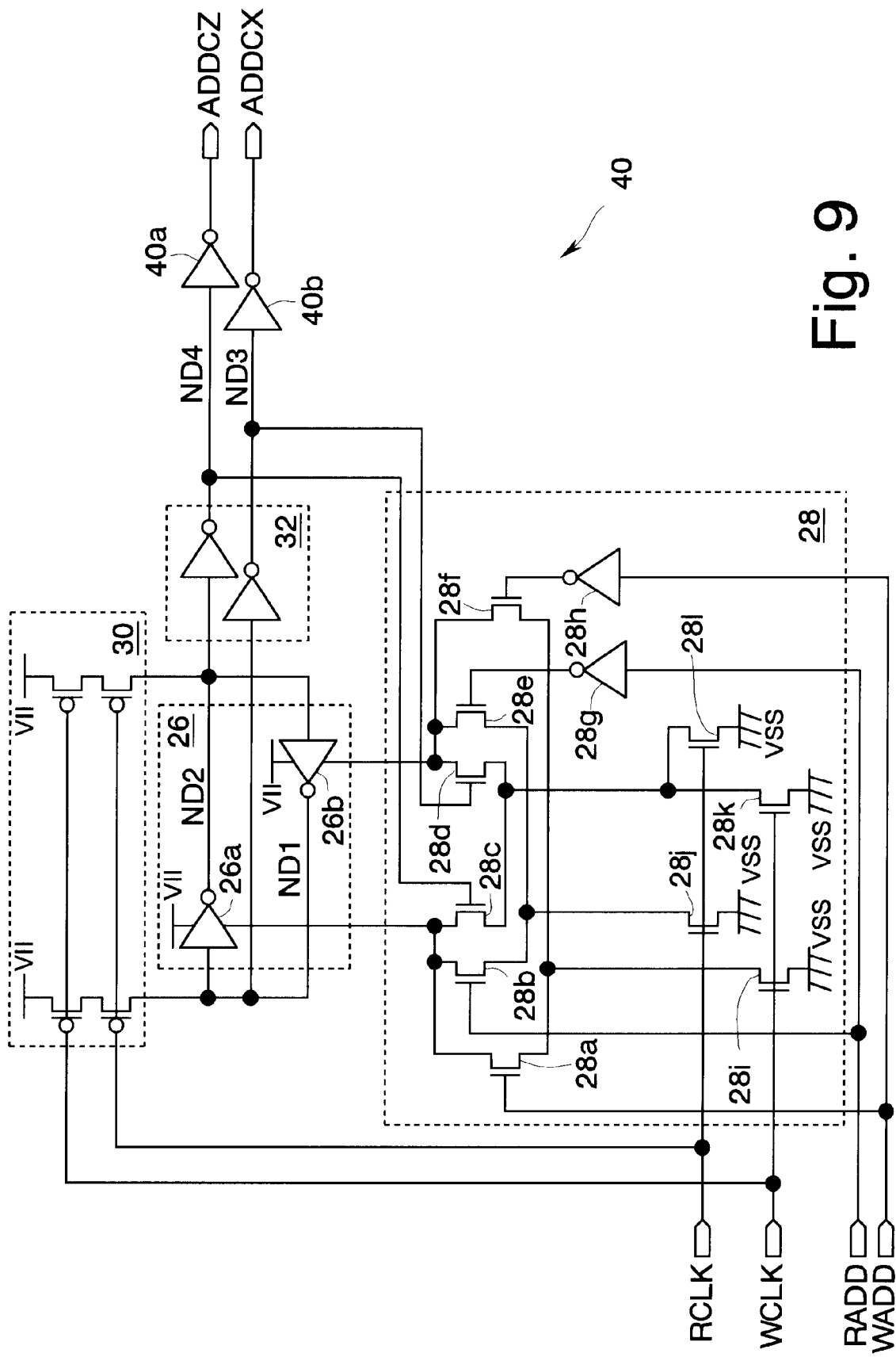
FIG. 9 is a circuit diagram showing the details of an address latching circuit according to a second embodiment of the semiconductor integrated circuit in the present invention.

FIG. 9 shows the details of an address latching circuit 40 according to a second embodiment of the semiconductor integrated circuit in the present invention. The circuit configuration excepting the address latching circuit 40 is identical to that of the first embodiment.

The address latching circuit 40 is constituted by removing the output circuit 34 and the output latch 36 from the address latching circuit 20 shown in FIG. 7. More specifically, the outputs of the buffer 32 are passed through inverters 40a and 40b, and output as the ADDCZ signal and the ADDCX signal. The other circuit configuration is the same as that of the address latching circuit 20.

Figure 10:
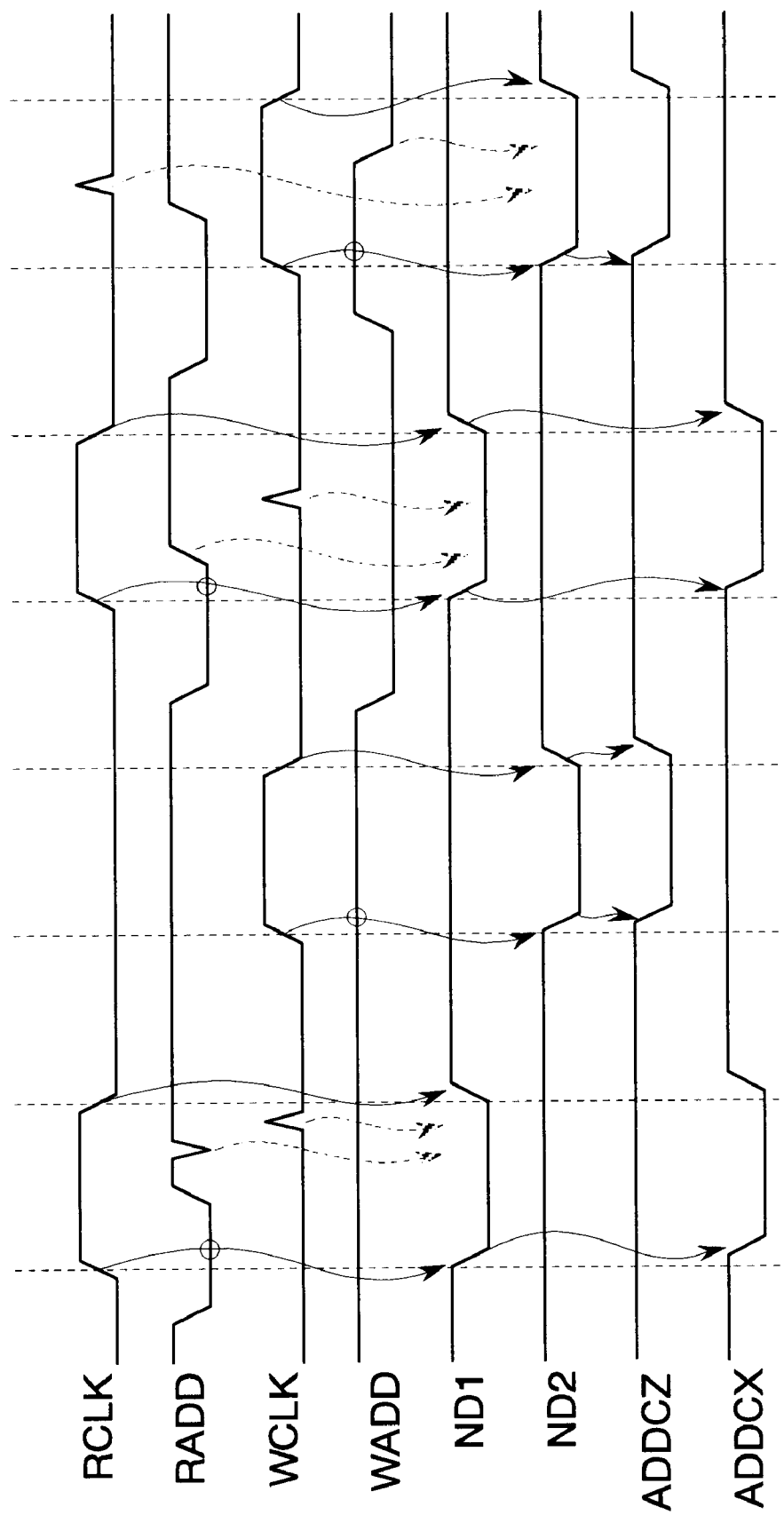
FIG. 10 is a timing chart showing the operation of the address latching circuit according to the second embodiment.

FIG. 10 shows the operation of the address latching circuit 40 in the case where read operations and write operations are performed alternately.

In this embodiment, both the ADDCZ signal and the ADDCX signal are set to high level (reset) on the inactivation of the latch 26. The predecoder 22 shown in FIG. 6 is inactivated when the ADDCZ signal and the ADDCX signal are at high level. The other timing is identical to that of FIG. 8.

The semiconductor integrated circuit in this embodiment can also provide the same effects as those of the first embodiment described above. Besides, in this embodiment, the nodes ND1 and ND2 are reset to high level by the resetting circuit 40 upon the inactivation of the RCLK signal and the WCLK signal. This makes it possible to inactivate the ADDCZ signal and the ADDCX signal easily.

The above-described embodiments have dealt with the cases where the present invention is applied to the address latching circuit of an SDRAM having a delayed write function. The present invention is not limited thereto. For example, the present invention may be applied to an address latching circuit in a defect relieving circuit for selecting redundant memory cells (word lines, bit lines) when supplied with addresses of defective memory cells (word lines, bit lines).

The above-described embodiments have dealt with the cases where the supply connecting circuit includes nMOSs and controls the nMOSs of the CMOS inverters 26a and 26b in the latch 26. The present invention is not limited thereto. For example, the power supply circuit may includes pMOSs and control the pMOSs of the CMOS inverters 26a and 26b.

The above-described embodiments have dealt with the cases where the present invention is applied to an SDRAM. The present invention is not limited thereto, and may be applied to DRAMs, SRAMs, or other semiconductor memories. The present invention is also applicable to system LSIs on which DRAM memory cores are implemented.

The semiconductor fabricating processes to which the present invention is applied are not limited to the CMOS process, and may be Bi-CMOS process.

The invention is not limited to the above embodiments and various modifications may be made without departing from the spirit and the scope of the invention. Any improvement may be made in part or all of the components.

What is claimed is:

1. A semiconductor integrated circuit comprising:
   a latch having two inverters cross-coupled with each other; and
   a supply connecting circuit for selecting one input signal from a plurality of input signals corresponding to a plurality of select signals in response to activation of any one of the select signals, and connecting a power supply line to a power supply terminal of either of said inverters depending on the input signal selected so that said latch is set to a predetermined latching state.

2. The semiconductor integrated circuit according to claim 1, further comprising a resetting circuit for resetting said latch upon inactivation of all of said select signals so that complementary output signals output from said latch become identical to each other in logical level.

3. The semiconductor integrated circuit according to claim 1, wherein said supply connecting circuit keeps providing said supply to said inverter in response to output of said latch in said predetermined latching state.

4. The semiconductor integrated circuit according to claim 1, further comprising:

a plurality of memory cells;

a control circuit for generating one of a write control signal and a read control signal as said select signal for accessing said memory cells in accordance with a command signal supplied from an exterior; and an address register for holding a write address signal supplied from the exterior in correspondence with said command signal indicating a write operation, and wherein said latch latches, as said input signal, one of said write address signal for a previous write operation output from said address register in synchronization with said write control signal, and a read address signal supplied from the exterior in synchronization with said read control signal.

5. The semiconductor integrated circuit according to claim 4, wherein said write address signal, said read address signal, and said command signal are supplied in synchronization with a clock signal supplied from the exterior.

6. The semiconductor integrated circuit according to claim 5, wherein data read from and written to said memory cells is input/output in synchronization with a rising edge and a falling edge of said clock signal.

7. The semiconductor integrated circuit according to claim 4, wherein said memory cells have a capacitor for storing electric charge corresponding to data.

* * * * *